(12) United States Patent
Nakamura (10) Patent No.: US 9,824,926 B1
(45) Date of Patent: Nov. 21, 2017

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/494,867

(22) Filed: Apr. 24, 2017

(30) Foreign Application Priority Data

Apr. 27, 2016 (JP) .................................. 2016-089088

(51) Int. Cl.
*H01L 21/78* (2006.01)
*H01L 21/683* (2006.01)

(52) U.S. Cl.
CPC .......... *H01L 21/78* (2013.01); *H01L 21/6836* (2013.01); *H01L 21/6838* (2013.01); *H01L 2221/68327* (2013.01); *H01L 2221/68363* (2013.01)

(58) Field of Classification Search
None
See application file for complete search history.

(56) References Cited

U.S. PATENT DOCUMENTS

| | | | | |
|---|---|---|---|---|
| 9,768,127 B2* | 9/2017 | Nakamura | ............. | H01L 23/562 |
| 2004/0009650 A1* | 1/2004 | Jeong | ................ | H01L 21/67132 |
| | | | | 438/462 |
| 2005/0170616 A1* | 8/2005 | Murata | ............... | H01L 21/3043 |
| | | | | 438/463 |
| 2008/0280421 A1* | 11/2008 | Nakamura | ......... | B23K 26/0057 |
| | | | | 438/462 |
| 2009/0121337 A1* | 5/2009 | Abe | .................... | B23K 26/0057 |
| | | | | 257/686 |
| 2010/0267219 A1* | 10/2010 | Kajiyama | .......... | B23K 26/0057 |
| | | | | 438/462 |
| 2013/0183811 A1* | 7/2013 | Kobayashi | .............. | H01L 21/78 |
| | | | | 438/463 |

FOREIGN PATENT DOCUMENTS

| | | |
|---|---|---|
| JP | 2002-192370 | 7/2002 |
| JP | 2014-007257 | 1/2014 |

OTHER PUBLICATIONS

U.S. Appl. No. 15/496,140, filed Apr. 25, 2017.

* cited by examiner

*Primary Examiner* — Andres Munoz
(74) *Attorney, Agent, or Firm* — Greer Burns & Crain, Ltd.

(57) ABSTRACT

A wafer is transferred to a holding surface of a chuck table by using a transfer unit having a suction pad. The front side of the wafer is held under suction through a protective tape on the holding surface, and the suction pad is removed from the back side of the wafer. A modified layer is formed on the back side of the wafer along division lines. The wafer is transferred by mounting the wafer held by the suction pad on the holding surface and sandwiching the wafer between the suction pad and the holding surface of the chuck table. A suction force is applied to the holding surface of the chuck table to thereby hold the front side of the wafer through the protective tape on the holding surface of the chuck table under suction, and the suction pad is then removed from the back side of the wafer.

1 Claim, 9 Drawing Sheets

WAFER PROCESSING METHOD

BACKGROUND OF THE INVENTION

Field of the Invention

The present invention relates to a wafer processing method for dividing a wafer into individual device chips by applying a laser beam to the wafer in the condition where the focal point of the laser beam is set inside the wafer to thereby form a modified layer inside the wafer.

Description of the Related Art

A plurality of devices such as integrated circuits (ICs) and large scale integrations (LSIs) are formed on the front side of a wafer so as to be separated by a plurality of crossing division lines. The wafer thus having the plural devices is divided along the division lines into individual device chips by using a dicing apparatus or a laser processing apparatus, for example. The device chips divided from the wafer are used in electrical equipment such as mobile phones and personal computers.

Further, there has been proposed a technique including the steps of attaching a protective tape to the front side of a wafer, next grinding the back side of the wafer to thereby thin the wafer, and next applying a laser beam having a transmission wavelength to the wafer to the back side of the wafer along each division line in the condition where the focal point of the laser beam is set inside the wafer to thereby form a modified layer as a division start point inside the wafer along each division line (see Japanese Patent No. 3408805, for example).

According to the technique disclosed in Japanese Patent No. 3408805, the width of each division line can be reduced to thereby increase the number of device chips that can be manufactured from one wafer as compared with the case of using a conventional dicing apparatus to form a division start point along each division line.

SUMMARY OF THE INVENTION

Figure 9:
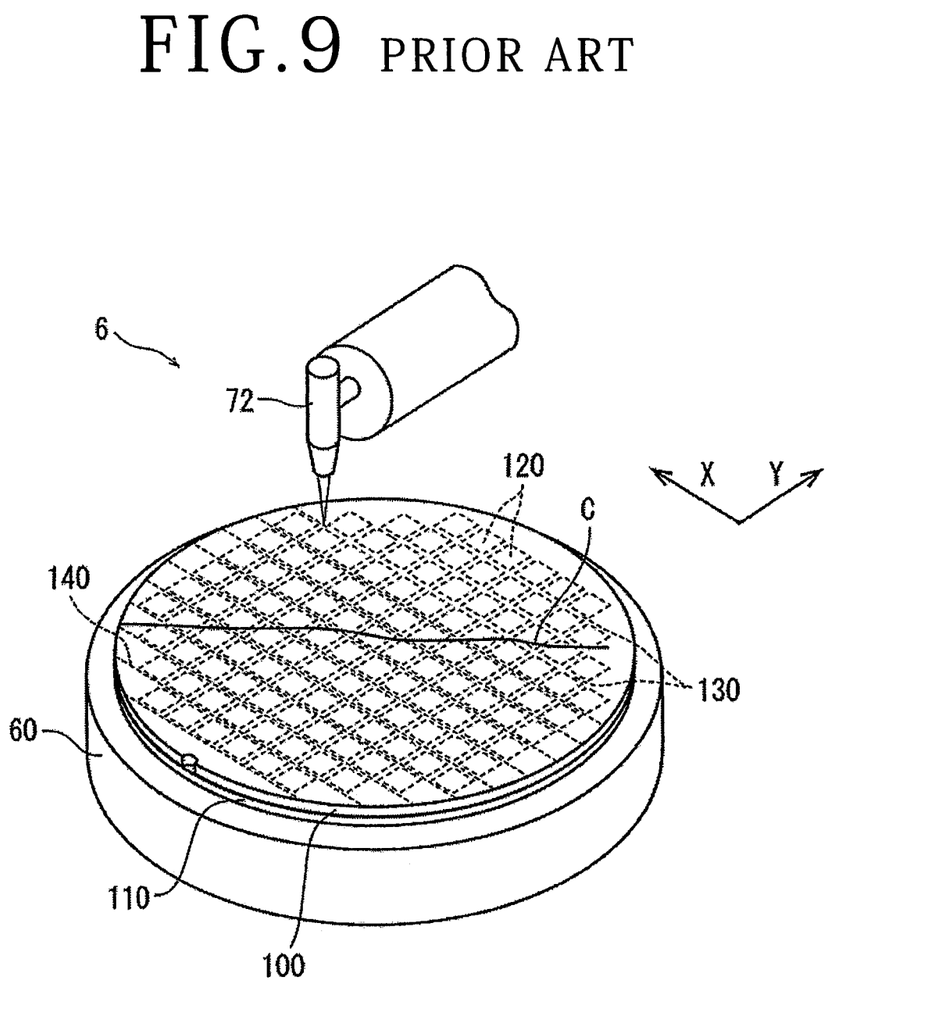
FIG. 9 is a perspective view showing a prior art related to the present invention.

The present inventor has found that in performing laser processing for forming a modified layer inside a wafer, there is a case that the wafer may be broken at a position different from each division line where the modified layer is to be formed (as shown by a solid line C in FIG. 9). Such a breaking phenomenon causes a problem such that the devices formed on the front side of the wafer may be partially damaged to remarkably reduce the production efficiency of each device chip.

Under these circumstances, the present inventor has closely studied the cause of the above breaking phenomenon to obtain the following findings. After performing a grinding step of grinding the back side of a wafer in a grinding apparatus, the wafer is unloaded from a chuck table included in the grinding apparatus and then transferred to a chuck table included in a laser processing apparatus by using transfer means having a suction pad. In the laser processing apparatus, a laser beam is applied to the wafer held on the chuck table to form a modified layer inside the wafer. In transferring the wafer from the chuck table of the grinding apparatus to the chuck table of the laser processing apparatus, the wafer is held by the suction pad under suction. At this time, a nonuniform internal stress is generated inside the wafer by a suction force applied to the suction pad. When this internal stress is not sufficiently relieved and the wafer is then held on the chuck table of the laser processing apparatus under suction, the internal stress due to the suction holding by the suction pad is partially left inside the wafer.

In the next modified layer forming step, the laser beam is applied to the wafer having such a residual internal stress. Due to the application of the laser beam, the residual internal stress causes the breaking phenomenon at an unintentional position.

It is therefore an object of the present invention to provide a wafer processing method which can prevent the breaking phenomenon at an unintentional position in a wafer in performing laser processing for forming a modified layer inside the wafer.

In accordance with an aspect of the present invention, there is provided a wafer processing method for dividing a wafer into a plurality of individual device chips along a plurality of crossing division lines formed on the front side of the wafer, the front side of the wafer being partitioned by the division lines to define a plurality of separate regions where a plurality of devices are formed, the individual device chips corresponding to the respective devices, the wafer processing method including a protective tape attaching step of attaching a protective tape to the front side of the wafer; a holding step of holding the protective tape attached to the front side of the wafer on a holding surface of a first chuck table under suction; a grinding step of grinding the back side of the wafer held on the first chuck table under suction, thereby thinning the wafer; an unloading step of holding the back side of the wafer held on the first chuck table by using a suction pad of transfer means after performing the grinding step, and next moving the suction pad to thereby unload the wafer from the first chuck table; a transfer step of transferring the wafer to a holding surface of a second chuck table by operating the transfer means after performing the unloading step, next holding the protective tape attached to the front side of the wafer on the holding surface of the second chuck table under suction, and next removing the suction pad from the back side of the wafer; and a modified layer forming step of applying a laser beam having a transmission wavelength to the wafer to the back side of the wafer along each division line in the condition where the focal point of the laser beam is set inside the wafer after performing the transfer step, thereby forming a modified layer inside the wafer along each division line; the transfer step including a mounting step of mounting the wafer held by the suction pad to the holding surface of the second chuck table; a sandwiching step of removing a suction force applied to the suction pad after performing the mounting step, and then sandwiching the wafer between the suction pad and the holding surface of the second chuck table; and a suction holding step of applying a suction force to the holding surface of the second chuck table after performing the sandwiching step to thereby hold the protective tape attached to the front side of the wafer on the holding surface of the second chuck table under suction, and next removing the suction pad from the back side of the wafer.

According to the present invention, in transferring the wafer from the suction pad to the second chuck table, the suction force applied to the suction pad holding the wafer under suction is removed to thereby relieve an internal stress in the wafer. Accordingly, the internal stress due to the suction holding by the suction pad is not left in the wafer and the wafer is next held on the second chuck table under suction. As a result, even when the laser beam is applied to the back side of the wafer held on the second chuck table in the modified layer forming step, there is no possibility that the devices may be partially damaged.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
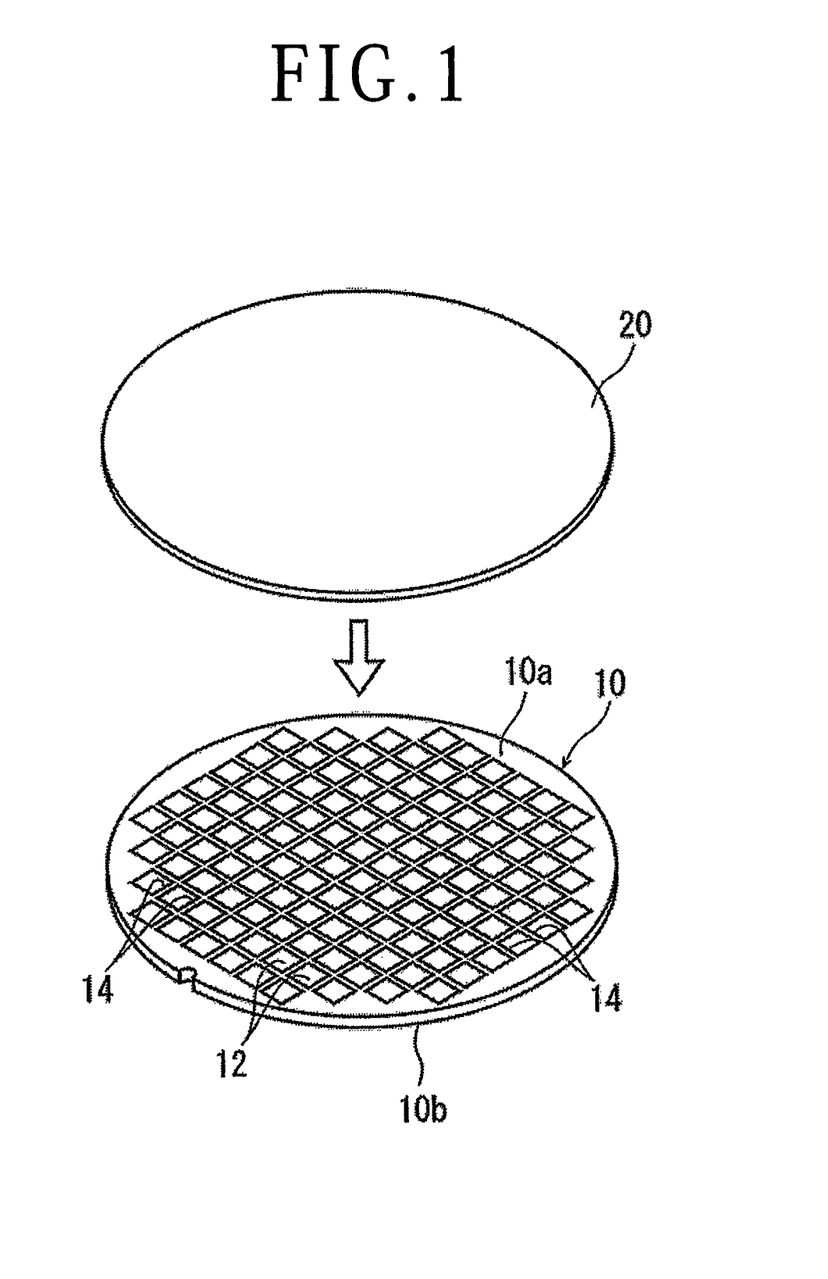
FIG. 1 is a perspective view showing a protective tape attaching step of attaching a protective tape to a silicon wafer.

A specific preferred embodiment of the wafer processing method according to the present invention will now be described in detail with reference to the attached drawings. Referring to FIG. 1, there is shown a silicon wafer 10 as a workpiece. The silicon wafer 10 has a front side 10a and a back side 10b. A protective tape 20 is attached to the front side 10a of the silicon wafer 10, so as to protect the front side 10a (protective tape attaching step). A plurality of crossing division lines 14 are formed on the front side 10a of the silicon wafer 10 to thereby define a plurality of separate regions where a plurality of devices 12 such as ICs are formed. The silicon wafer 10 originally has a thickness of 755 µm, for example, before grinding. The protective tape 20 is composed of a base sheet and an adhesive layer formed on one side of the base sheet. The base sheet has a thickness of 100 µm, and the adhesive layer has a thickness of approximately 5 µm. The base sheet is formed of polyvinyl chloride (PVC), and the adhesive layer is formed of acrylic resin.

Figure 2A:
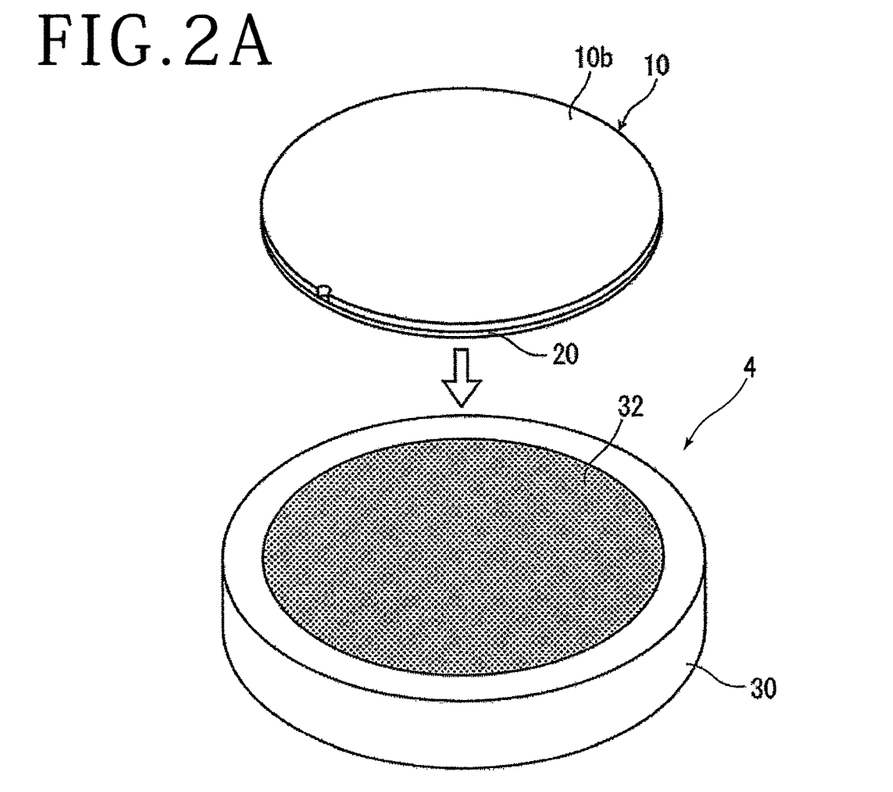
FIGS. 2A and 2B are perspective views showing a holding step of holding the silicon wafer on a first chuck table of a grinding apparatus.
Figure 2B:
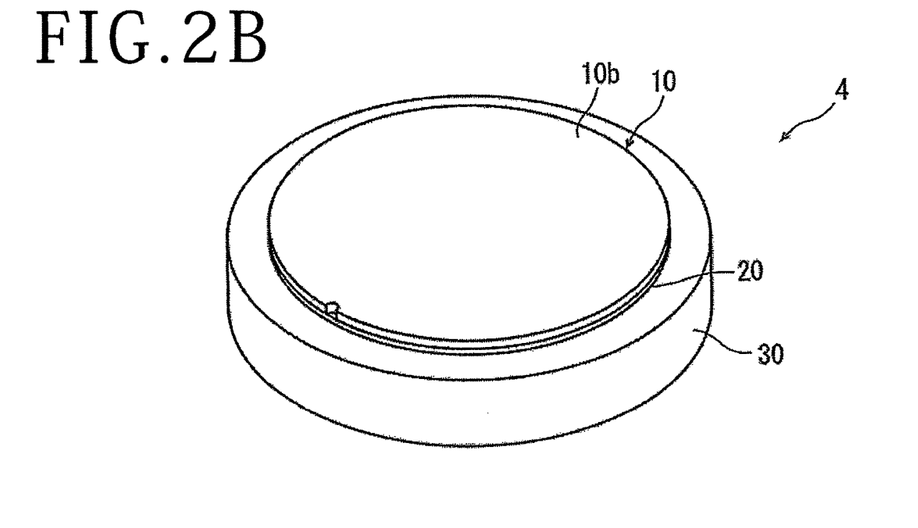

After performing the protective tape attaching step, a holding step is performed as shown in FIGS. 2A and 2B. Referring to FIG. 2A, there is shown a grinding apparatus 4 (the whole configuration thereof being not shown). The grinding apparatus 4 includes a first chuck table 30 having a holding surface 32 for holding the silicon wafer 10. As shown in FIG. 2A, the silicon wafer 10 with the protective tape 20 attached to the front side 10a is placed on the holding surface 32 of the first chuck table 30 in the condition where the protective tape 20 is in contact with the holding surface 32 and the back side 10b as a work surface is oriented upward (see FIG. 2B). The first chuck table 30 is rotatable by a rotational drive mechanism (not shown). The holding surface 32 is formed of a porous material allowing air communication, and it is connected to suction means (not shown). In the condition shown in FIG. 2B, the suction means is operated to firmly hold the silicon wafer 10 through the protective tape 20 on the holding surface 32 of the first chuck table 30 under suction without displacement (holding step).

Figure 3:
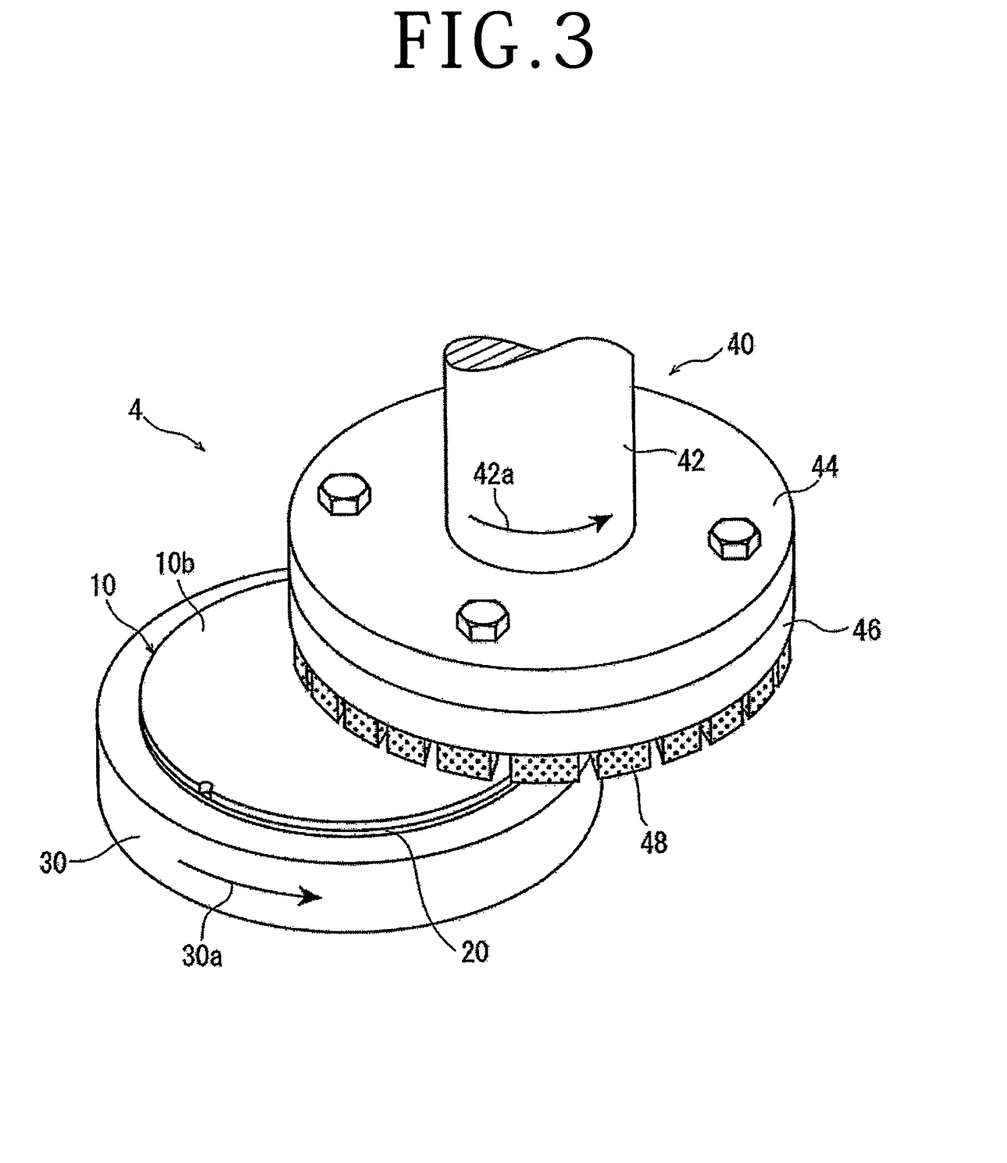
FIG. 3 is a perspective view showing a grinding step of grinding the back side of the silicon wafer held on the first chuck table.

After performing the holding step, a grinding step is performed by using the grinding apparatus 4 as shown in FIG. 3. Referring to FIG. 3, the grinding apparatus 4 includes grinding means 40 for grinding the back side 10b of the silicon wafer 10 held on the first chuck table 30 to thereby reduce the thickness of the silicon wafer 10. The grinding means 40 includes a spindle 42 adapted to be rotated by a rotational drive mechanism (not shown), a mounter 44 fixed to the lower end of the spindle 42, and a grinding wheel 46 mounted on the lower surface of the mounter 44. The grinding wheel 46 is composed of a base and a plurality of abrasive members 48 fixed to the lower surface of the base so as to be arranged annularly along the outer circumference of the base.

In the condition where the silicon wafer 10 is held through the protective tape 20 on the first chuck table 30 under suction, the first chuck table 30 is rotated at 300 rpm, for example, in the direction shown by an arrow 30a in FIG. 3, and the spindle 42 is also rotated at 3400 rpm, for example, in the direction shown by an arrow 42a in FIG. 3. Thereafter, the grinding means 40 is lowered to bring the abrasive members 48 of the grinding wheel 46 into contact with the back side 10b of the silicon wafer 10. Further, the grinding means 40 is fed downward by a predetermined amount at a feed speed of 1 µm/second, for example, in the direction perpendicular to the holding surface 32 of the first chuck table 30. At this time, the thickness of the silicon wafer 10 may be measured by a contact type measuring gauge (not shown) during the grinding operation. For example, the back side 10b of the silicon wafer 10 is ground until the thickness of the silicon wafer 10 becomes a predetermined thickness of 60 µm, for example. Thus, the grinding step is finished.

Figure 4:
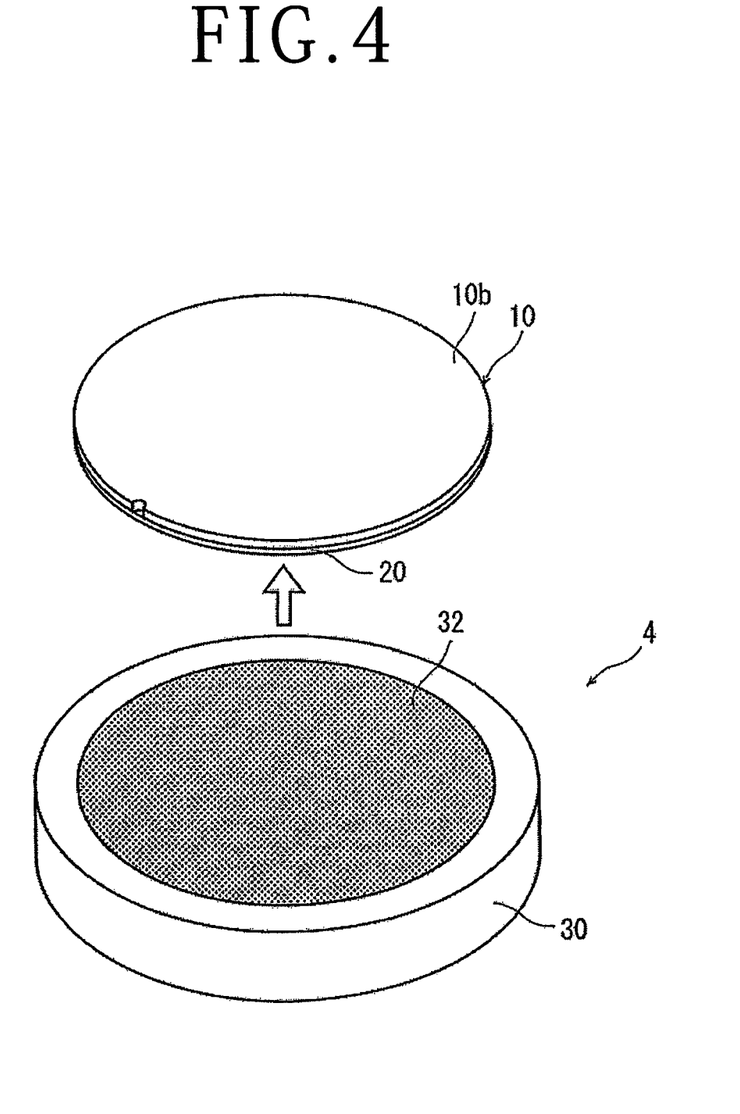
FIG. 4 is a perspective view schematically showing an unloading step of unloading the silicon wafer from the first chuck table.
Figure 5A:
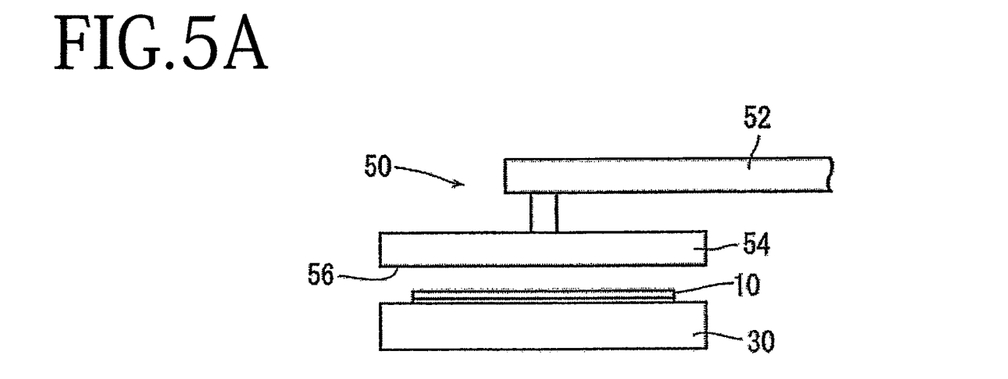
FIGS. 5A to 5C are side views for specifically illustrating the unloading step shown in FIG. 4.
Figure 5B:
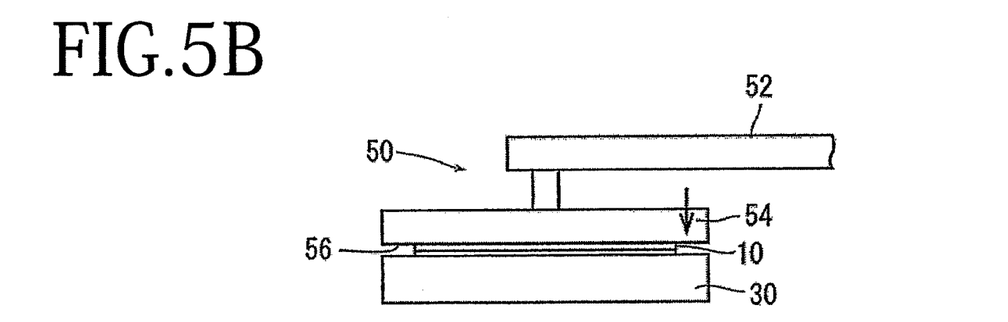
Figure 5C:
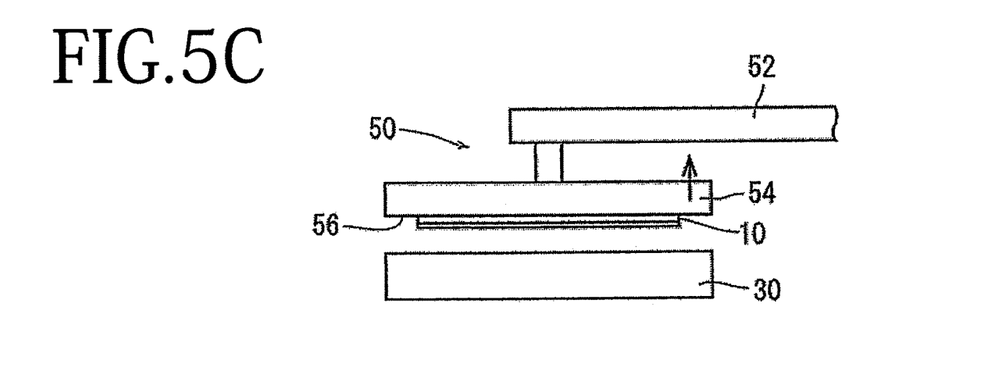

After performing the grinding step, an unloading step is performed as shown in FIG. 4 in such a manner that the silicon wafer 10 with the protective tape 20 is unloaded from the first chuck table 30. The unloading step will now be described in more detail with reference to FIGS. 5A to 5C. As shown in FIGS. 5A to 5C, the unloading step is performed by using transfer means 50 (the whole configuration thereof being not shown). The transfer means 50 includes a transfer arm 52 and a suction pad 54 provided at the front end of the transfer arm 52 so as to be oriented downward. The transfer arm 52 is movable horizontally and vertically by a moving mechanism (not shown). The suction pad 54 is a disk-shaped member having substantially the same size as that of the first chuck table 30. The suction pad 54 has a lower surface functioning as a suction holding surface 56. The suction holding surface 56 is formed of a porous material allowing air communication, and it is connected through the transfer arm 52 to suction means (not shown).

In performing the unloading step, the transfer arm 52 is first moved by the moving mechanism to position the suction pad 54 directly above the silicon wafer 10 held on the first chuck table 30 as shown in FIG. 5A. Thereafter, the moving mechanism is operated to lower the transfer arm 52 until the suction holding surface 56 of the suction pad 54 comes into abutment against the back side 10b of the silicon wafer 10 held on the first chuck table 30. At this time, the distance between the suction holding surface 56 of the suction pad 54 and the back side 10b of the silicon wafer 10 is measured by a proximity sensor (not shown). Thus, the silicon wafer 10 is sandwiched between the first chuck table 30 and the suction pad 54 as shown in FIG. 5B.

Thereafter, the suction means connected to the suction pad 54 is operated to hold the back side 10b of the silicon wafer 10 under suction. Accordingly, the silicon wafer 10 is held under suction by both the holding surface 32 of the first chuck table 30 and the suction holding surface 56 of the suction pad 54. Thereafter, a suction force applied to the first chuck table 30 is removed, so that the silicon wafer 10 is held under suction only by the suction pad 54. Thereafter, the transfer arm 52 is lifted to thereby move the silicon wafer 10 away from the first chuck table 30 as shown in FIG. 5C. Thusly, the unloading step is finished.

Figure 6:
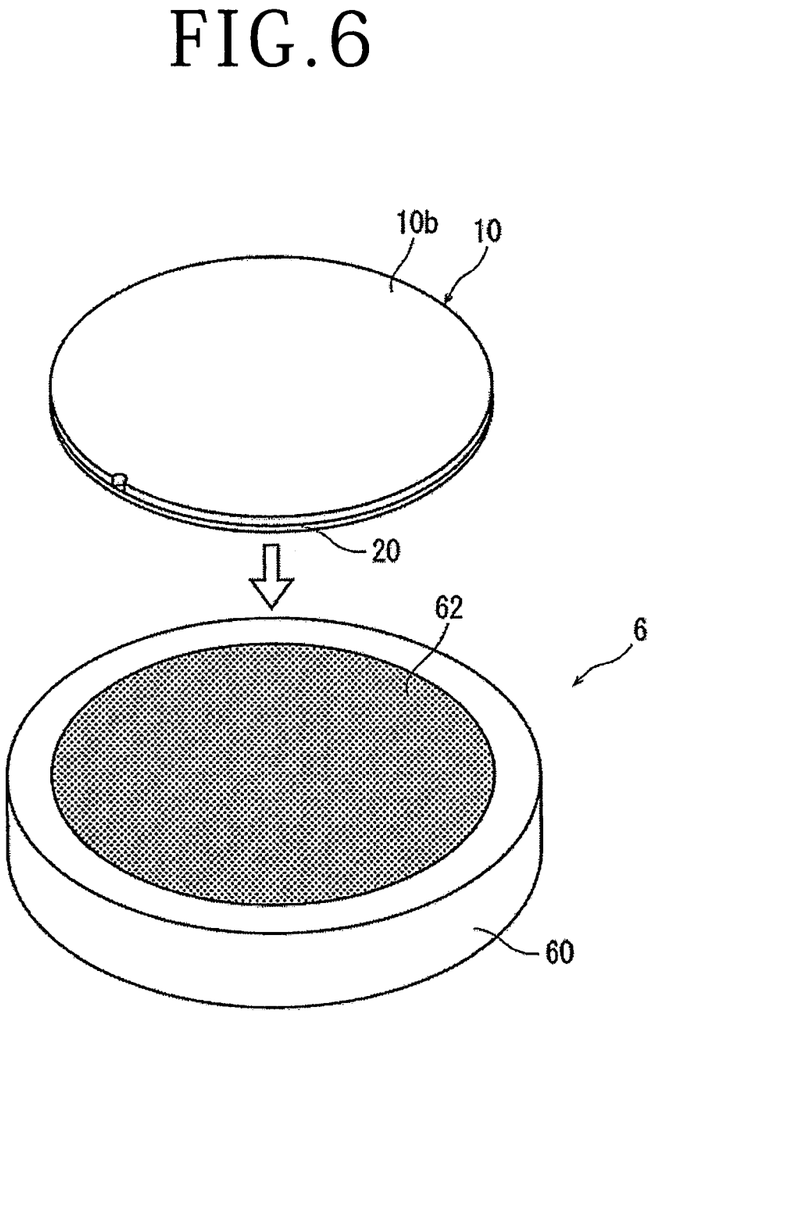
FIG. 6 is a perspective view schematically showing a transfer step of transferring the silicon wafer from the first chuck table to a second chuck table of a laser processing apparatus.

After performing the unloading step, a transfer step is performed as shown in FIG. 6 in such a manner that the silicon wafer 10 with the protective tape 20 is transferred to a second chuck table 60 included in a laser processing apparatus 6 (the whole configuration thereof being not shown) for forming a modified layer inside the silicon wafer 10. In the transfer step, the silicon wafer 10 is held on the second chuck table 60 in the condition where the protective tape 20 is in contact with the upper surface of the second chuck table 60. Thereafter, the suction pad 54 is moved away from the back side 10b of the silicon wafer 10. As similar to the first chuck table 30, the upper surface of the second chuck table 60 functions as a holding surface 62 for holding the silicon wafer 10 under suction. The holding surface 62 is formed of a porous material allowing air communication, and it is connected to suction means (not shown). The laser processing apparatus 6 is located adjacent to the grinding apparatus 4, and the transfer means 50 is so arranged as to transfer the silicon wafer 10 from the grinding apparatus 4 to the laser processing apparatus 6. The transfer step will now be described in more detail with reference to FIGS. 7A to 7D.

Figure 7A:
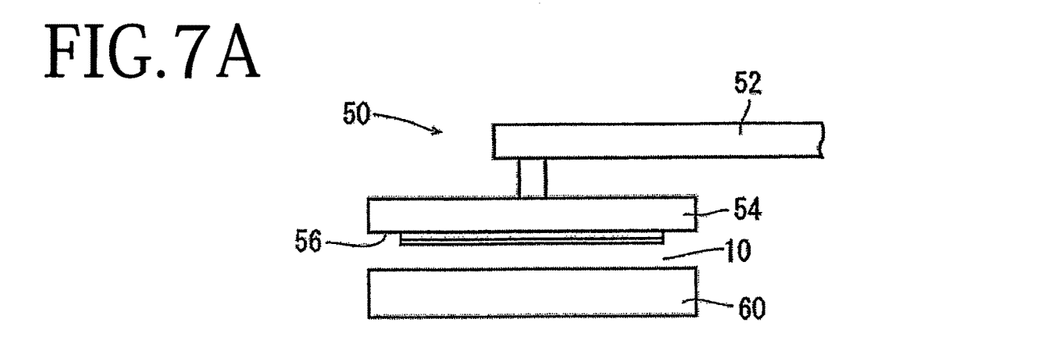
FIGS. 7A to 7D are side views for specifically illustrating the transfer step shown in FIG. 6.
Figure 7B:
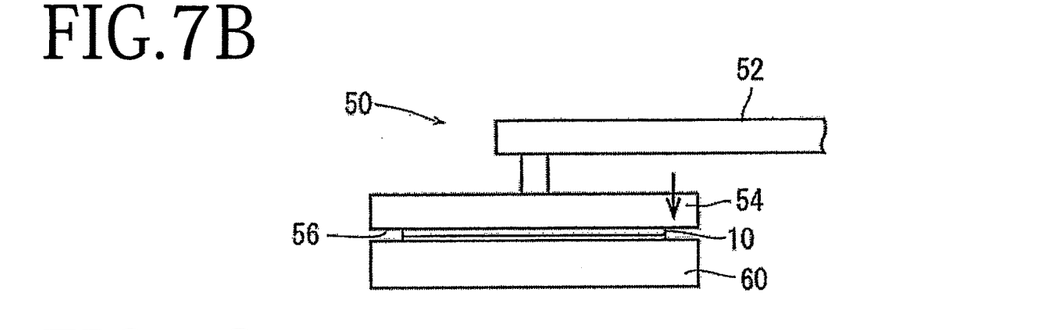

As shown in FIG. 7A, the moving mechanism for moving the transfer arm 52 is operated to move the transfer arm 52 and position the suction pad 54 holding the silicon wafer 10 directly above the second chuck table 60 of the laser processing apparatus 6 for forming a modified layer inside the silicon wafer 10. Thereafter, the moving mechanism is operated to lower the transfer arm 52 until the protective tape 20 attached to the front side 10a of the silicon wafer 10 held by the suction pad 54 comes into abutment against the holding surface 62 of the second chuck table 60. At this time, the distance between the protective tape 20 of the silicon wafer 10 and the holding surface 62 of the second chuck table 60 is measured by a proximity sensor (not shown). Thus, the silicon wafer 10 is mounted on the holding surface 62 of the second chuck table 60 in the condition where the silicon wafer 10 is held by the suction pad 54 as shown in FIG. 7B (mounting step).

Figure 7C:
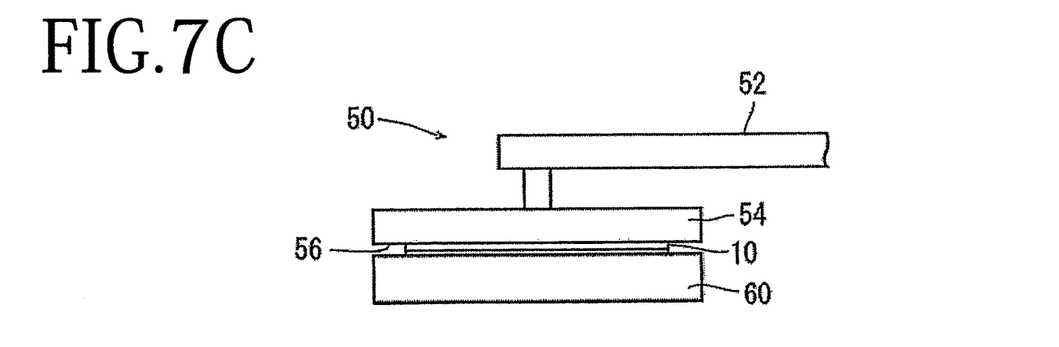

After performing the mounting step, a suction force applied to the suction pad 54 is removed. At this time, a suction force has not yet been applied to the holding surface 62 of the second chuck table 60. The removal of the suction force applied to the suction pad 54 may be effected by physically blocking a suction passage connected to the suction pad 54 or by stopping a suction pump included in the suction means connected to the suction pad 54. Any other methods for removing the suction force applied from the suction pad 54 to the silicon wafer 10 may be adopted. Accordingly, the silicon wafer 10 is physically sandwiched between the suction pad 54 and the second chuck table 60 without receiving a suction force from the suction pad 54 and the second chuck table 60 as shown in FIG. 7C (sandwiching step).

Figure 7D:
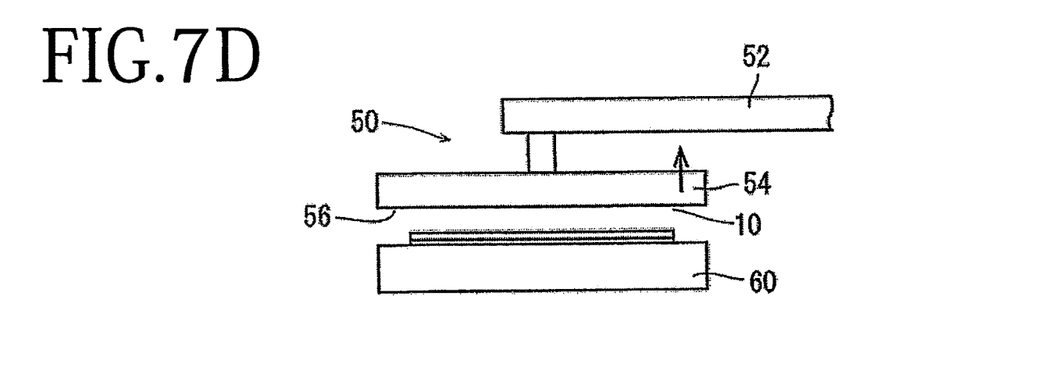

After performing the sandwiching step, a suction force is applied to the holding surface 62 of the second chuck table 60, thereby holding the silicon wafer 10 through the protective tape 20 on the holding surface 62 under suction. Thereafter, the transfer arm 52 is lifted to move the suction pad 54 away from the back side 10b of the silicon wafer 10 as shown in FIG. 7D. Thus, the silicon wafer 10 is held by only the second chuck table 60 under suction (suction holding step). In this manner, the mounting step, the sandwiching step, and the suction holding step are sequentially performed to thereby finish the transfer step.

Figure 8A:
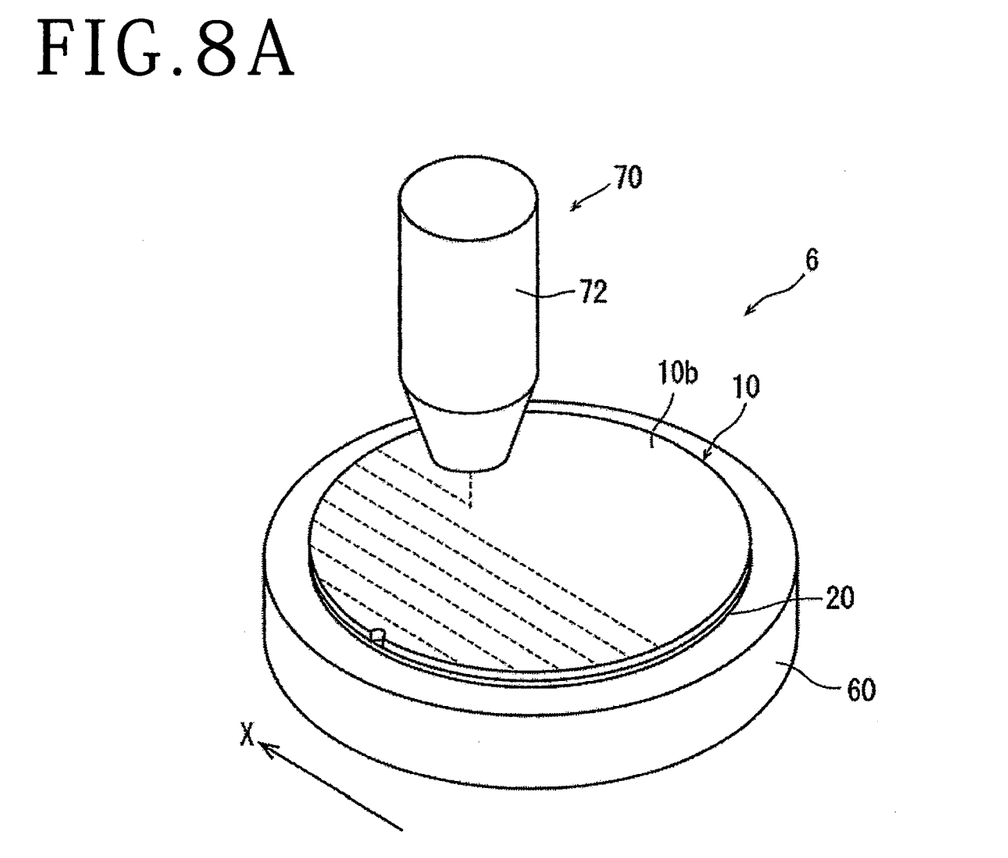
FIG. 8A is a perspective view showing a modified layer forming step of forming a modified layer inside the silicon wafer held on the second chuck table.
Figure 8B:
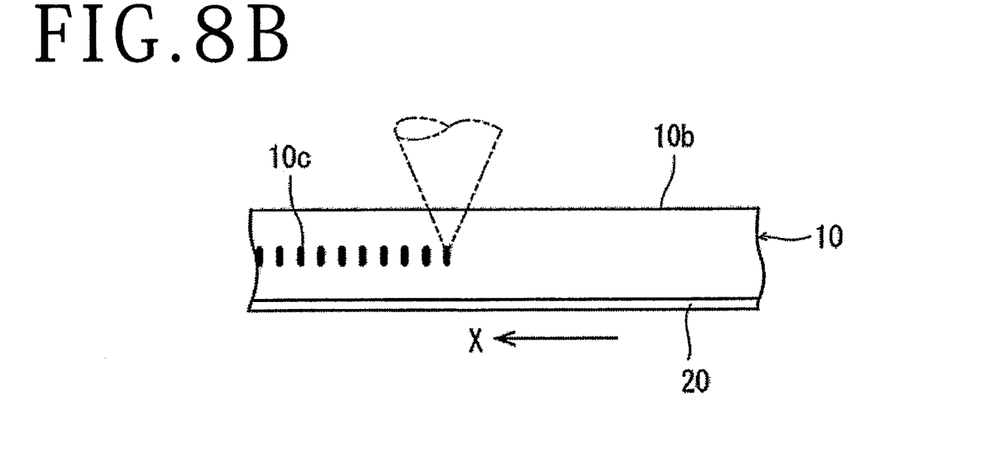
FIG. 8B is an enlarged sectional view of the silicon wafer shown in FIG. 8A.

After performing the transfer step, a modified layer forming step is performed as shown in FIGS. 8A and 8B in such a manner that a laser beam is applied from laser beam applying means 70 included in the laser processing apparatus 6 to the silicon wafer 10 along each division line 14 to thereby form a modified layer 10c as a division start point inside the silicon wafer 10 along each division line 14. More specifically, an alignment step is first performed to align a laser beam applying position with a predetermined one of the division lines 14 by using imaging means (not shown). Thereafter, the laser beam applying means 70 of the laser processing apparatus 6 is operated to oscillate a laser beam having a transmission wavelength to the silicon wafer 10 from a laser oscillator (not shown) included in the laser beam applying means 70. The laser beam oscillated is applied through focusing means 72 included in the laser beam applying means 70 to the back side 10b of the silicon wafer 10 held through the protective tape 20 on the second chuck table 60 in the condition where the focal point of the laser beam is set inside the silicon wafer 10. At the same time, the second chuck table 60 is moved in the X direction shown by an arrow X in FIGS. 8A and 8B at a predetermined feed speed. Accordingly, the modified layer 10c is formed inside the silicon wafer 10 along the predetermined division line 14. Although not shown, the laser processing apparatus 6 further includes X moving means for moving the second chuck table 60 in the X direction, Y moving means for moving the second chuck table 60 in the Y direction perpendicular to the X direction, and rotating means for rotating the second chuck table 60. By controlling the laser beam applying means 70, the X moving means, the Y moving means, and the rotating means, the laser processing operation mentioned above is repeated along all of the other division lines 14 to thereby form a plurality of similar modified layers 10c inside the silicon wafer 10 along all of the other division lines 14. Thereafter, an external force may be applied to the silicon wafer 10 by using any external force applying means known in the art to thereby divide the silicon wafer 10 into individual device chips corresponding to the respective devices 12.

For example, the modified layer forming step using the laser beam applying means 70 is performed under the following processing conditions. As described above, the silicon wafer 10 originally has a thickness of 755 μm, and the back side 10b of the silicon wafer 10 is ground by the grinding step mentioned above to reduce the thickness of the silicon wafer 10 to a thickness of 60 μm. Accordingly, the thickness of the silicon wafer 10 in the modified layer forming step is 60 μm.

Wavelength: 1342 nm
Average power: 0.18 W
Repetition frequency: 80 kHz
Spot diameter: 1 μm
Work feed speed: 180 mm/second
Focal position: 32 μm from the front side 10*a* (28 μm from the back side 10*b*).

With the above configuration of the present invention, the following particular effects can be exhibited. In the transfer step of transferring the silicon wafer 10 to the second chuck table 60 of the laser processing apparatus 6, the silicon wafer 10 held by the suction pad 54 is brought into abutment against the holding surface 62 of the second chuck table 60. Before applying a suction force to the second chuck table 60, the suction force applied to the suction pad 54 is removed. In this condition, no suction force is applied from the suction pad 54 and the second chuck table 60 to the silicon wafer 10, and the silicon wafer 10 is physically sandwiched between the suction pad 54 and the second chuck table 60. Accordingly, it is possible to once completely relieve an internal stress generated in the silicon wafer 10 due to the suction holding by the suction pad 54. Further, since the silicon wafer 10 is physically sandwiched between the suction pad 54 and the second chuck table 60, the silicon wafer 10 can be thereafter held on the second chuck table 60 under suction without displacement. As a result, even when the silicon wafer 10 is subjected to laser processing in the modified layer forming step, there is no possibility of unintentional breaking due to residual internal stress in the silicon wafer 10. Accordingly, it is possible to prevent the problem that the devices 12 formed on the silicon wafer 10 may be partially damaged to cause a reduction in production efficiency.

In the above preferred embodiment, the unloading step and the transfer step are performed by using the same suction pad 54 of the transfer means 50 to transfer the silicon wafer 10 from the first chuck table 30 of the grinding apparatus 4 to the second chuck table 60 of the laser processing apparatus 6. However, this configuration is merely illustrative and any other modifications may be made. For example, the silicon wafer 10 may be once transferred from the first chuck table 30 of the grinding apparatus 4 to a cleaning table as another table by using the suction pad 54 in the unloading step. After cleaning the silicon wafer 10 on the cleaning table after performing the grinding step, the silicon wafer 10 may be next transferred from this cleaning table to the second chuck table 60 of the laser processing apparatus 6 by using another suction pad in the transfer step. In this case, the transfer step shown in FIGS. 7A to 7D may be similarly performed in transferring the silicon wafer 10 from the cleaning table to the second chuck table 60.

Further, while the silicon wafer 10 is used as a workpiece in this preferred embodiment, the workpiece usable in the present invention may include any wafer such that a modified layer may be formed inside the wafer along each division line after grinding the wafer. Examples of such a wafer include sapphire, silicon carbide (SiC), lithium tantalate (LT), and lithium niobate (LN) wafers.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer processing method for dividing a wafer into a plurality of individual device chips along a plurality of crossing division lines formed on a front side of said wafer, the front side of said wafer being partitioned by said plurality of crossing division lines to define a plurality of separate regions where a plurality of devices are formed, said plurality individual device chips corresponding to said plurality of devices, said wafer processing method comprising:

a protective tape attaching step of attaching a protective tape to the front side of said wafer;

a holding step of holding said protective tape attached to the front side of said wafer on a holding surface of a first chuck table under suction;

a grinding step of grinding a back side of said wafer held on said first chuck table under suction, thereby thinning said wafer;

an unloading step of holding the back side of said wafer held on said first chuck table by using a suction pad of transfer means after performing said grinding step, and next moving said suction pad to thereby unload said wafer from said first chuck table;

a transfer step of transferring said wafer to a holding surface of a second chuck table by operating said transfer means after performing said unloading step, next holding said protective tape attached to the front side of said wafer on the holding surface of said second chuck table under suction, and next removing said suction pad from the back side of said wafer; and a modified layer forming step of applying a laser beam having a transmission wavelength to said wafer to the back side of said wafer along each crossing division line of the plurality of crossing division lines in a condition where a focal point of said laser beam is set inside said wafer after performing said transfer step, thereby forming a modified layer inside said wafer along each crossing division line of the plurality of crossing division lines;

said transfer step including a mounting step of mounting said wafer held by said suction pad to the holding surface of said second chuck table, a sandwiching step of removing a suction force applied to said suction pad after performing said mounting step, and then sandwiching said wafer between said suction pad and the holding surface of said second chuck table, and a suction holding step of applying a suction force to the holding surface of said second chuck table after performing said sandwiching step to thereby hold said protective tape attached to the front side of said wafer on the holding surface of said second chuck table under suction, and next removing said suction pad from the back side of said wafer.

* * * * *

UNITED STATES PATENT AND TRADEMARK OFFICE
CERTIFICATE OF CORRECTION

PATENT NO. : 9,824,926 B1
APPLICATION NO. : 15/494867
DATED : November 21, 2017
INVENTOR(S) : Masaru Nakamura Page 1 of 1

It is certified that error appears in the above-identified patent and that said Letters Patent is hereby corrected as shown below:

In the Claims

Column 8, Line 12, insert --of-- between "plurality" and "individual".

Signed and Sealed this
Tenth Day of April, 2018

Andrei Iancu
*Director of the United States Patent and Trademark Office*